(12) United States Patent
Laneryd et al.

(10) Patent No.: US 10,244,650 B2
(45) Date of Patent: Mar. 26, 2019

(54) PRESSURE COMPENSATED SUBSEA ELECTRICAL SYSTEM

(71) Applicant: ABB Schweiz AG, Baden (CH)

(72) Inventors: Tor Laneryd, Enköping (SE); Thomas Gradinger, Aarau Rohr (CH); Heinz Lendenmann, Västerås (SE); Esa Virtanen, Vaasa (FI); Thomas Wagner, Mägenwil (CH); Timo Koivuluoma, Vantaa (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/504,222

(22) PCT Filed: Aug. 10, 2015

(86) PCT No.: PCT/EP2015/068376
§ 371 (c)(1),
(2) Date: Feb. 15, 2017

(87) PCT Pub. No.: WO2016/026729
PCT Pub. Date: Feb. 25, 2016

(65) Prior Publication Data
US 2017/0280577 A1    Sep. 28, 2017

(30) Foreign Application Priority Data

Aug. 22, 2014  (EP) .................................. 14181874

(51) Int. Cl.
*H05K 7/20* (2006.01)
*H02M 7/06* (2006.01)
(Continued)

(52) U.S. Cl.
CPC ............. *H05K 5/068* (2013.01); *F28D 1/022* (2013.01); *H01F 27/14* (2013.01); *H02M 7/068* (2013.01);
(Continued)

(58) Field of Classification Search
CPC ........... H05K 7/29236; H05K 7/20245; H05K 7/20272; H05K 7/20927; H05K 7/20236; F28D 1/022; H02M 7/068
See application file for complete search history.

(56) References Cited

U.S. PATENT DOCUMENTS 2,023,100 A * 12/1935 Rose ..................... H01J 13/02
313/12
3,091,722 A * 5/1963 Rusiniak ................ H05K 5/067
165/104.32
(Continued)

FOREIGN PATENT DOCUMENTS

CN    101753037 A    6/2010
CN    103715551 A    4/2014
(Continued)

OTHER PUBLICATIONS

European Search Report Application No. 14181874.0 Completed: Jan. 23, 2015; dated Jan. 30, 2015 11 Pages.
(Continued)

*Primary Examiner* — Robert J Hoffberg
(74) *Attorney, Agent, or Firm* — Whitmyer IP Group LLC

(57) ABSTRACT

A pressure compensated subsea electrical system and a pressure compensated subsea electrical system which has a housing filled with a dielectric liquid. The housing has a first housing portion and a second housing portion in pressure communication with each other. The first housing portion includes a transformer, and the second housing portion includes a power converter. The pressure compensated subsea electrical system includes a pressure compensator arranged to compensate pressure inside the housing. The pressure compensator is enabled to compensate pressure in both the first housing portion and the second housing portion.

10 Claims, 5 Drawing Sheets

(51) Int. Cl.
*F28D 1/02* (2006.01)
*H05K 5/06* (2006.01)
*H01F 27/14* (2006.01)

(52) U.S. Cl.
CPC ......... *H05K 7/209* (2013.01); *H05K 7/20236* (2013.01); *H05K 7/20927* (2013.01)

(56) References Cited

U.S. PATENT DOCUMENTS

| | | | | |
|---|---|---|---|---|
| 3,200,881 | A | * | 8/1965 | Bucks ................ F25D 31/00 165/104.21 |
| 3,564,386 | A | * | 2/1971 | Leonard ............. H02M 7/10 174/139 |
| 3,858,090 | A | * | 12/1974 | Lehmann .......... H05K 7/20236 165/104.33 |
| 3,962,622 | A | * | 6/1976 | Franke ................ H01F 29/02 363/126 |
| 5,305,184 | A | * | 4/1994 | Andresen ............ H01L 23/44 165/104.33 |
| 5,373,417 | A | * | 12/1994 | Barrett ................ H01L 23/42 165/80.4 |
| 6,867,364 | B2 | | 3/2005 | Hafskjold et al. |
| 7,847,189 | B2 | * | 12/2010 | Findeisen ........... H01H 9/0044 174/17 CT |
| 7,983,041 | B2 | | 7/2011 | Godfroy et al. |
| 8,000,102 | B2 | * | 8/2011 | Johnston ............. B03C 3/68 336/65 |
| 8,439,080 | B2 | | 5/2013 | Uusipaikka |
| 9,056,663 | B2 | * | 6/2015 | Bo ...................... B63G 8/08 |
| 9,203,218 | B2 | * | 12/2015 | Boe ..................... H02G 1/10 |
| 9,496,798 | B2 | * | 11/2016 | Boe ..................... B63G 8/08 |
| 9,777,966 | B2 | * | 10/2017 | Chan ................... H05K 7/20236 |
| 9,781,862 | B2 | * | 10/2017 | Kolstad ............... H05K 7/20245 |
| 9,899,142 | B2 | * | 2/2018 | Zhang ................. H01F 27/325 |
| 9,964,249 | B2 | * | 5/2018 | Bjerknes ............. H05B 3/023 |
| 10,026,537 | B2 | * | 7/2018 | Bjoerkhaug ........ H01F 27/16 |
| 2007/0034360 | A1 | * | 2/2007 | Hall .................... G06F 1/183 165/104.33 |
| 2008/0302115 | A1 | | 12/2008 | Eknes et al. |
| 2010/0139544 | A1 | | 6/2010 | Bo |
| 2016/0150671 | A1 | * | 5/2016 | Spindler ............. E21B 33/0355 361/714 |
| 2017/0112021 | A1 | * | 4/2017 | Gradinger ........... H05K 7/20236 |
| 2017/0148565 | A1 | * | 5/2017 | Zhang ................. H01F 27/325 |
| 2018/0017199 | A1 | * | 1/2018 | Bjerknes ............. H05B 3/023 |
| 2018/0270987 | A1 | * | 9/2018 | Yuan ................... H05K 7/20236 |

FOREIGN PATENT DOCUMENTS

| | | | | |
|---|---|---|---|---|
| CN | 104183364 | A | | 12/2014 |
| DE | 10127276 | A1 | | 1/2003 |
| EP | 2487326 | A1 | * | 8/2012 ......... E21B 41/0007 |
| EP | 2487327 | A1 | | 8/2012 |
| EP | 2571034 | A1 | | 3/2013 |
| EP | 2579438 | A1 | | 4/2013 |
| EP | 2666956 | A1 | | 11/2013 |
| EP | 2717401 | A1 | | 4/2014 |
| EP | 2988580 | A1 | * | 2/2016 ......... H05K 7/20236 |
| GB | 719512 | A | * | 12/1954 ............. H05G 1/02 |
| JP | 2660875 | B2 | * | 10/1997 |
| JP | 09271178 | A | | 10/1997 |
| WO | WO 2005093551 | A2 | * | 10/2005 ............... G06F 1/20 |
| WO | 2008055515 | A1 | | 5/2008 |
| WO | WO-2013124270 | A1 | * | 8/2013 ............. H05B 3/023 |
| WO | WO 2013124270 | A1 | * | 8/2013 ............. H05B 3/023 |
| WO | 2014071985 | A1 | | 5/2014 |

OTHER PUBLICATIONS

International Preliminary Report on Patentability Application No. PCT/EP2015/068376 Completed: Nov. 15, 2016 12 Pages.
International Search Report & Written Opinion of the International Searching Authority Application No. PCT/EP2015/068376 Completed: Sep. 30, 2015; dated Oct. 12, 2015 16 Pages.
Written Opinion of International Examining Authority Application No. PCT/EP2015/068376 dated Jul. 7, 2016 5 Pages.
Russian Office Action and Search Report with translation Application No. 2017109375/07(016242) dated May 22, 2018 7 pages.
Chinese Office Action & Translation, Application No. 201580045533. 4, dated Oct. 9, 2018, 11 Pages.

* cited by examiner

PRESSURE COMPENSATED SUBSEA ELECTRICAL SYSTEM

TECHNICAL FIELD

The invention relates to subsea electrical systems, and particularly to a pressure compensated subsea electrical system.

BACKGROUND

In general terms, electric subsea installations and devices usually demand high standards regarding durability, long-term functionality and independence during operation. Electric subsea installations that need to be cooled during operation, such as subsea converters, require an autonomous and durable cooling of its components. It is known to use a dielectric liquid of low compressibility such as for example mineral oil as a cooling fluid. The dielectric fluid could also be composed of natural or synthetic esters. In general terms, the dielectric fluid is used to provide a pressure compensated environment, and additionally functions as an electric insulation medium of electric components, such as capacitor units, placed in the electric installation. The tanks of power-electronic subsea equipment, such as subsea converters, are thus typically filled with oil, which acts as a combined electric insulation and cooling medium. The oil receives heat from the internal converter components and transfers it to the sea-water through the tank wall or through a heat exchanger.

In some cases the tank is provided with a pressure compensation system, so that the internal pressure is close or equal to the external pressure. Arrangements comprising such pressure compensation systems will henceforth be called pressure compensated arrangements. The provision of a pressure compensation system imposes significantly less stress on the tank walls in comparison to tanks (such as being part of a subsea electrical system) without pressure compensation systems. For example, the pressure at 3000 meters depth is 300 bar.

Commonly, a power converter requires several electrical connections to a transformer. Known subsea power systems typically position the power converter and the transformer in separate tanks with separate pressure compensation systems, and with wet connections for the electrical coupling.

FIG. 1 schematically illustrates such a known pressure compensated subsea electrical system 1a. The pressure compensated subsea electrical system 1a comprises a first tank comprising a transformer 3 and a second tank comprising a power converter 4. The tanks are joined by a connection. Each tank is filled with a dielectric fluid 12 and has its own separate pressure compensation system 2a, 2b.

WO 2008/055515 (see, especially FIG. 3 therein) describes a converter and a transformer, both located within one liquid-tight housing. According to WO 2008/055515 the converter is located within a further liquid-tight housing and there is consequently no fluid communication between them.

EP2579438 (see, especially FIG. 6 therein) discloses a converter and a transformer but does not mention fluid communication.

Known from prior art (such as in WO 2008/055515) is also a pressure compensated subsea electrical system where a liquid-filled converter tank is placed inside a main vessel which also houses the transformer. FIG. 2 schematically illustrates such a known pressure compensated subsea electrical system 1b. The subsea electrical system 1b thus comprises a first tank, filled with a dielectric fluid 12, comprising a transformer 3 and having a pressure compensation system 2a. The first tank in turn further comprises a second tank. The second tank, also filled with a dielectric fluid 12, comprises a power converter 4 and has a pressure compensation system 2b.

In general terms, the power converter has high thermal losses but requires low temperatures in order to operate efficiently. The tank wall surface is in general not sufficient to achieve the required cooling. The surface can be extended by using tank corrugations, cooling fins, or an external heat exchanger, but this increases the cost and weight of the pressure compensated subsea electrical system. On the other hand, the transformer is less sensitive to high temperatures.

EP 2 717401 A1 relates to a subsea electrical power system. The subsea electrical power system includes a first subsea electric device having a first subsea enclosure and a second subsea electric device having a second subsea enclosure. The first subsea electric device and the second subsea electric device are mounted on a common frame. A duct is provided between the first subsea enclosure and the second subsea enclosure.

In view of the above there is still a need for an improved pressure compensated subsea electrical system comprising a transformer and a power converter.

SUMMARY

An object of embodiments herein is to provide efficient pressure compensated subsea electrical systems comprising a transformer and a power converter.

Particularly, according to a first aspect there is presented a pressure compensated subsea electrical system. The pressure compensated subsea electrical system comprises a housing filled with a dielectric liquid. The housing has a first housing portion and a second housing portion in pressure communication with each other. The first housing portion comprises a transformer, and the second housing portion comprises a power converter. The pressure compensated subsea electrical system comprises a pressure compensator arranged to compensate pressure inside the housing. The pressure compensator is enabled to compensate pressure in both the first housing portion and the second housing portion.

Having a subsea power converter and a subsea transformer placed in a shared housing filled with dielectric liquid brings a number of advantages and technical effects.

Advantageously, only one pressure compensation system is required.

Advantageously, there is no need for wet connections between subsea power converter and subsea transformer.

Advantageously, the housing will have a large surface that can be used to reduce the power converter operating temperature.

Advantageously, the housing can be extended vertically to improve natural convective flow of the dielectric liquid.

Advantageously, this allows for temperature sensitive components to be placed in cold environment.

Advantageously, the subsea transformer can be positioned such that transformer losses generate a natural convective flow of the dielectric liquid that helps to cool the subsea power converter. This can be achieved either by positioning the transformer above the power converter or by providing cooling channels through a dividing wall.

Advantageously, temperature gradients within semiconductor arrangements and absolute temperatures can be reduced.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Cooling systems for electric equipment, and specifically for subsea electrical systems, are used to cool down electric components, such as transformers, power converters, power electronic building blocks, semiconductor modules, connectors, and capacitor units. Such electric components generate heat that needs to be dissipated by the cooling system. The cooling systems of subsea electrical systems are usually designed in a simple manner avoiding any unnecessary parts and mechanisms. Generally it is desirable to have passive cooling systems, thus cooling systems without any driven or powered parts, such as for example without pumps, to cool down the electric equipment. In some cases natural convection is used. Cooling by natural convection uses the heat transfer from the cooling liquid to the surrounding sea water to generate circulation within the cooling system and thus within the electrical systems.

Figure 1:
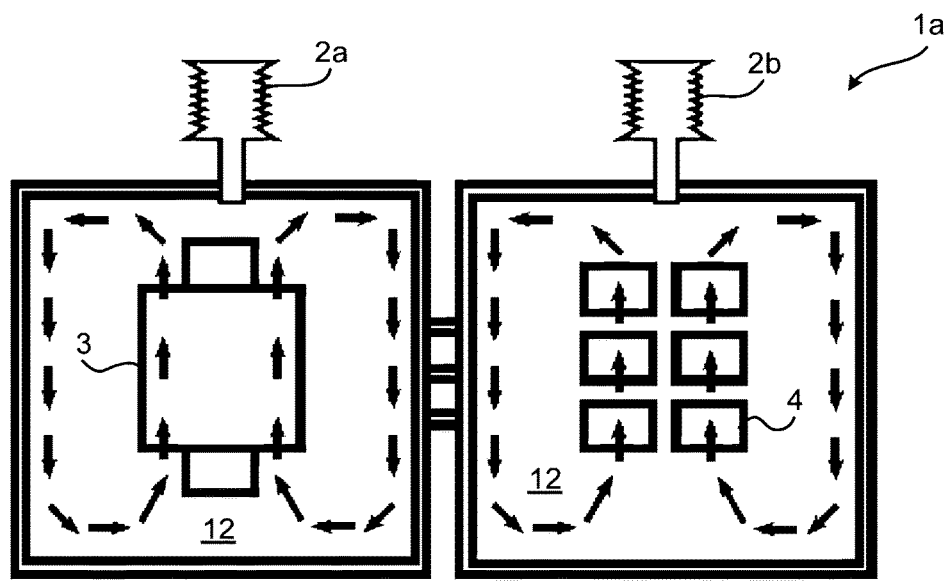
FIGS. 1 and 2 schematically illustrate pressure compensated subsea electrical systems according to prior art.
Figure 2:
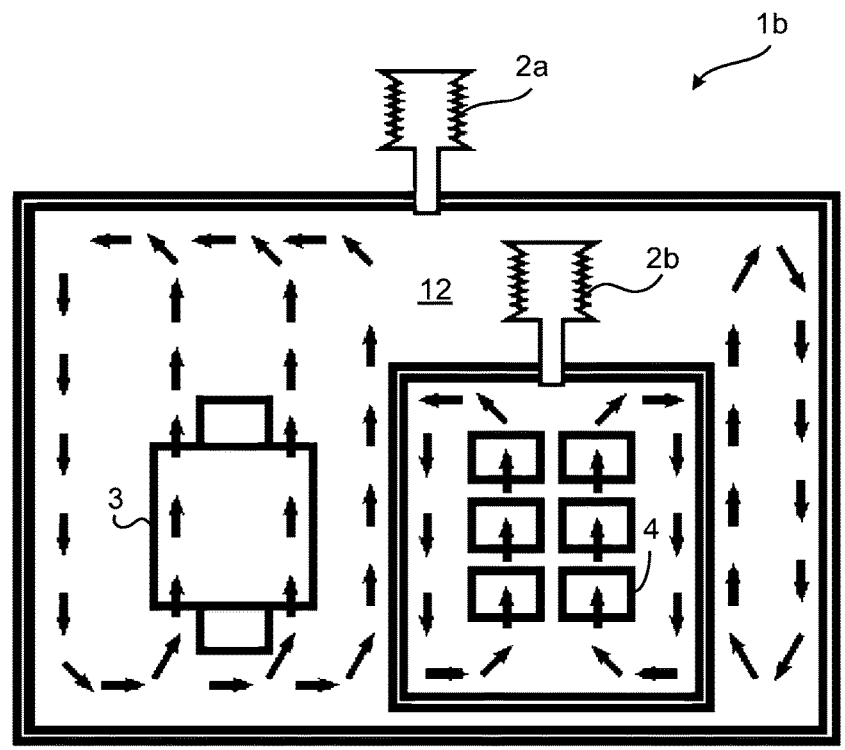
Figure 3:
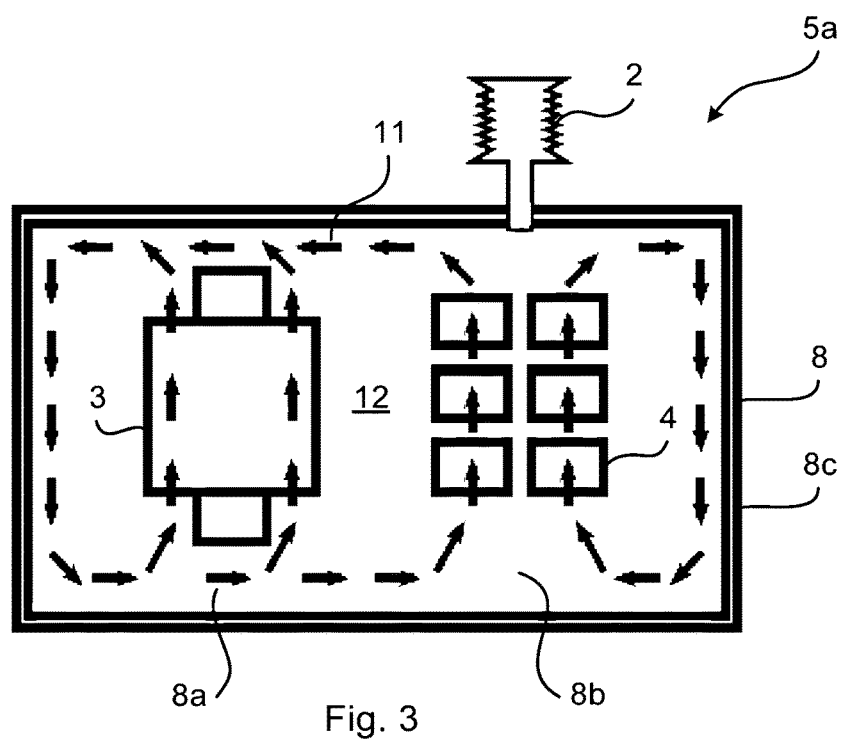
FIGS. 3, 4, 6, 8, and 9 schematically illustrate pressure compensated subsea electrical systems according to embodiments.
Figure 4:
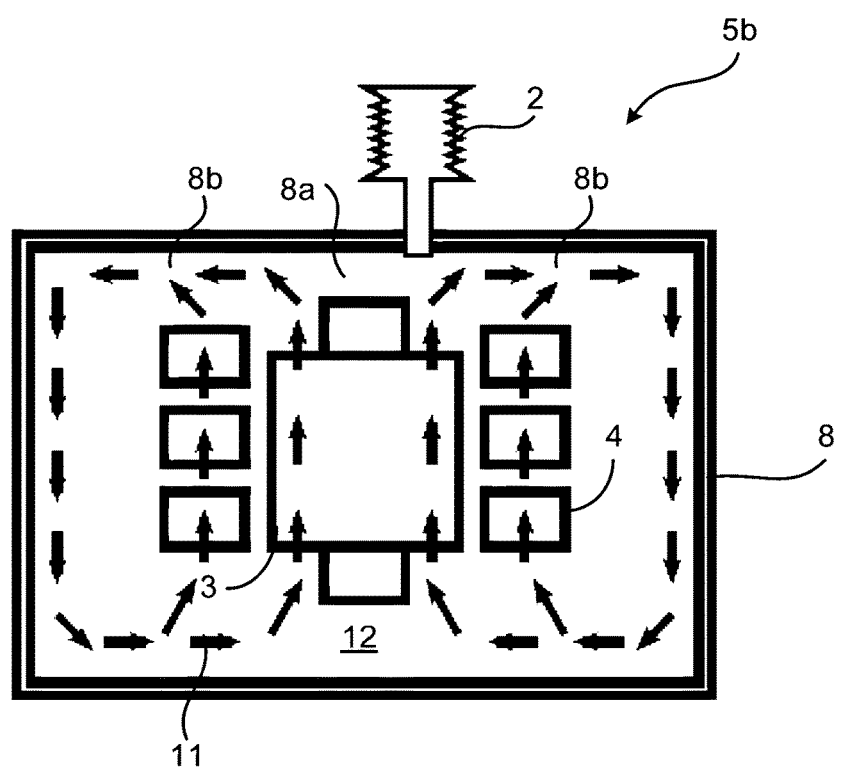
Figure 5:
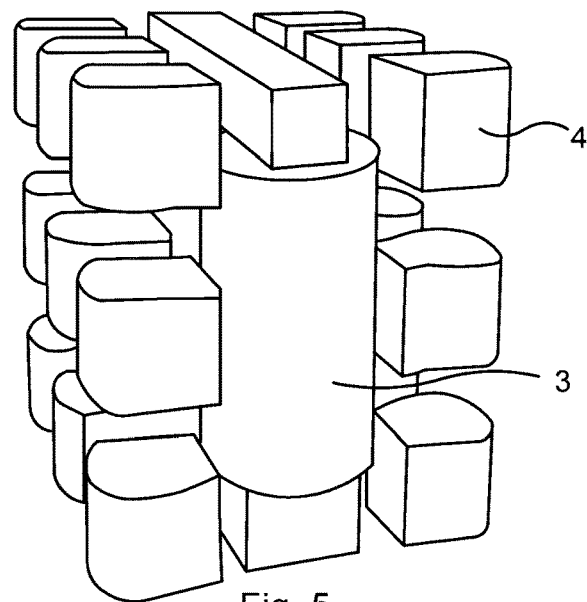
FIGS. 5 and 7 schematically illustrate arrangements of a transformer and power converter components for use in a pressure compensated subsea electrical system according to embodiments.
Figure 6:
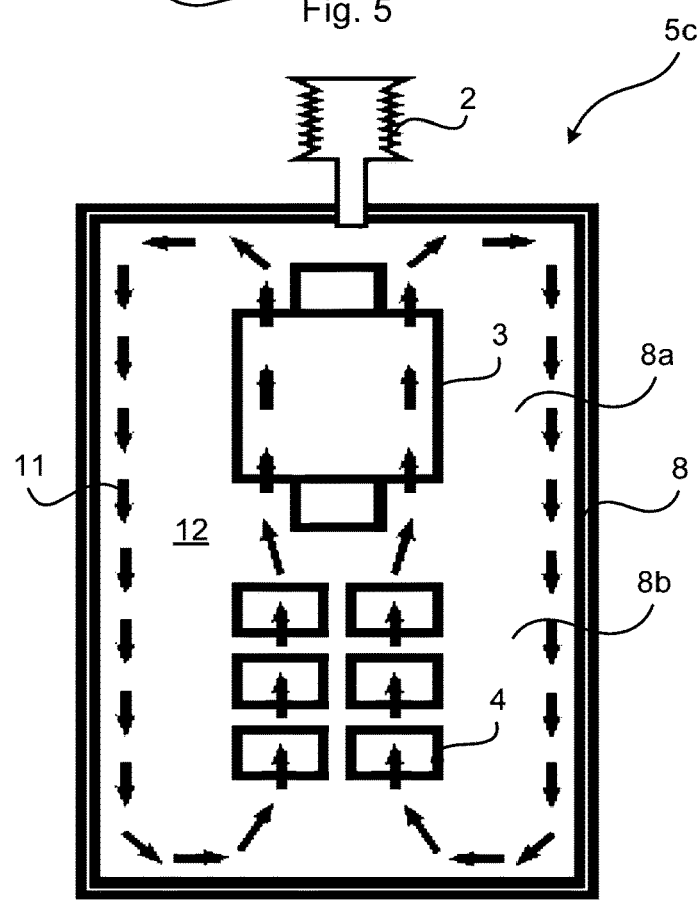
Figure 7:
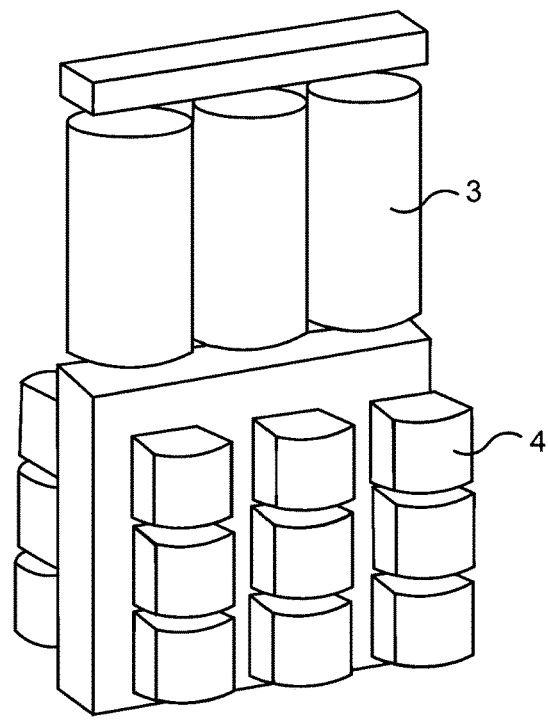

Reference is now made to FIGS. 3 to 9. FIGS. 3, 4, 6, 8, and 9 are cross-sectional side views illustrating pressure compensated subsea electrical systems according to embodiments. FIGS. 5 and 7 schematically illustrate arrangements of a transformer and power converter components for use in a pressure compensated subsea electrical system according to embodiments.

In general terms, there is provided a pressure compensated subsea electrical system 5a, 5b, 5c, 5d, 5e.

The pressure compensated subsea electrical system 5a, 5b, 5c, 5d, 5e comprises a housing 8. The housing 8 may be a tank. The housing 8 is filled with a dielectric liquid 12. The dielectric liquid 12 may be oil. The housing 8 has a first housing portion 8a and a second housing portion 8b. The first housing portion 8a and the second housing portion 8b are in pressure communication with each other. The pressure communication may be fluid communication. The first housing portion 8a comprises a transformer 3, and the second housing portion 8b comprises a power converter 4.

The pressure compensated subsea electrical system 5a, 5b, 5c, 5d, 5e further comprises a pressure compensator 2. The pressure compensator 2 is arranged to compensate pressure inside the housing 8. The pressure compensator 2 is enabled to compensate pressure in both the first housing portion 8a and the second housing portion 8b.

Particular advantages and technical effects for such a pressure compensated subsea electrical system 5a, 5b, 5c, 5d, 5e have been summarized above. Particularly, only one pressure compensation system, as defined by the pressure compensator 2, is required for the first housing portion 8a and the second housing portion 8b.

In use, electrical components such as the transformer 3 and the power converter 4 generate heat. In general terms, for some electric components increased temperature is a common stress factor. In subsea environments, such as in subsea electrical systems, which require high reliability, the thermal stress should thus be limited to a minimum. In the electrical components energy is dissipated during operation. This energy is conducted to the outer walls of the electrical components, where it is transported to the surroundings, such as to a dielectric liquid 12 surrounding the electrical components. From the dielectric liquid 12 heat is transferred to the surrounding water. In more detail, heat from the dielectric liquid 12 is transferred to the walls of the housing 8 and from there to the water surrounding the housing 8. Efficient cooling of the electrical components enables the electrical components hotspot temperature to be limited.

Particular optional features of such pressure compensated subsea electrical systems will now be described.

The first housing portion 8a may comprise a tank wall 8c for transferring heat from the power converter 4. The tank wall 8c may comprise corrugations or cooling fins.

Figure 8:
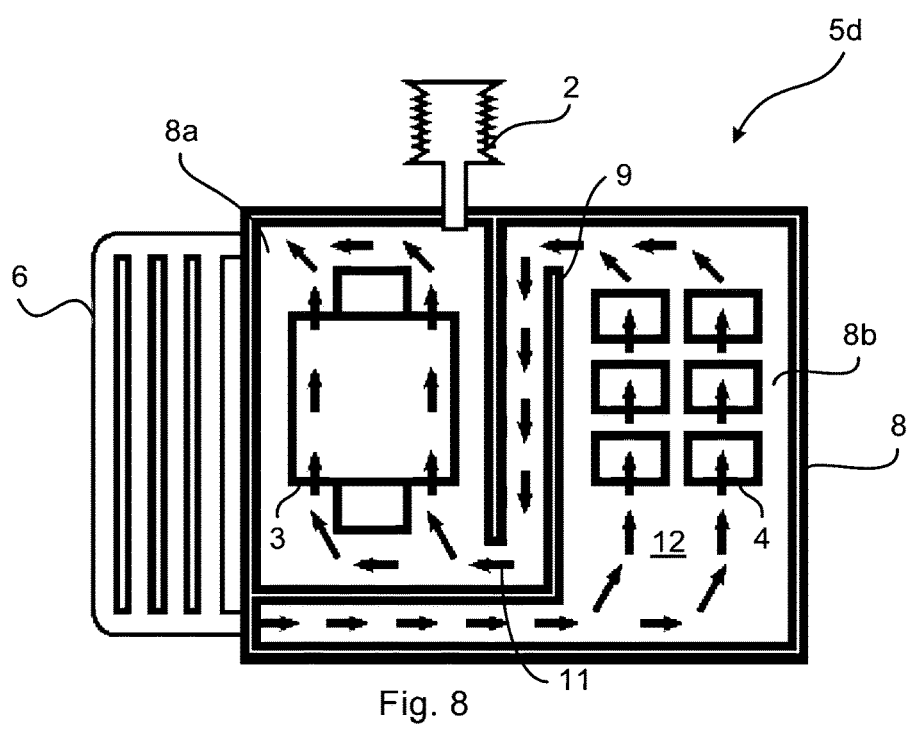
Figure 9:
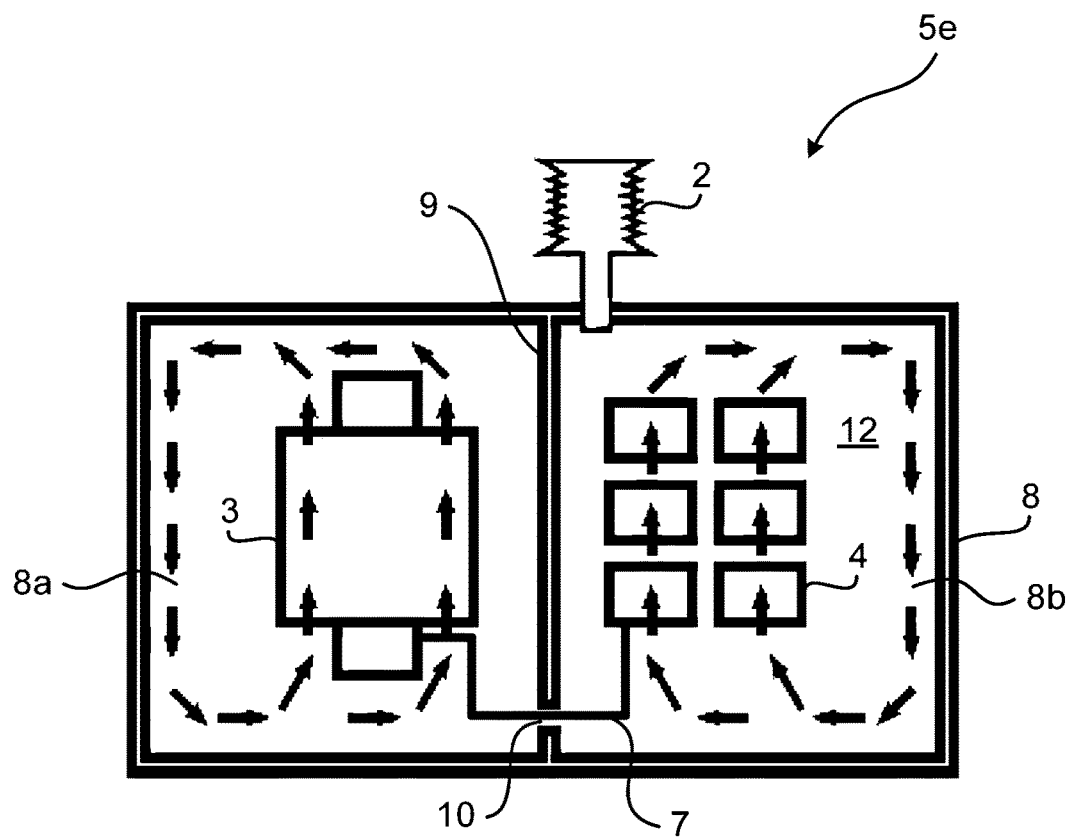

There may be different ways to provide the first housing portion 8a and the second housing portion 8b in the housing 8. For example the housing 8 may further comprise at least one separating wall 9. The at least one separating wall 9 may be arranged between the power converter 4 and the transformer 3. Examples of such pressure compensated subsea electrical systems 5d and 5e are schematically illustrated in FIGS. 8 and 9.

For such pressure compensated subsea electrical systems 5d and 5e the pressure communication may consist of at least one through hole 10 in the at least one separating wall 9. An example of such a pressure compensated subsea electrical system 5e is schematically illustrated in FIG. 9. Alternatively the at least one separating wall 9 acts as a guide for guiding a flow of the dielectric liquid between the first housing portion 8a and the second housing portion 8b. An example of such a pressure compensated subsea electrical system 5d is schematically illustrated in FIG. 8.

There may be different dimensions of the through hole (or through holes). For example, the at least one through hole has a total cross section of at least 1 square centimeter. Hence, the total cross section of all through holes may be at least 1 square centimeter.

There may be different ways to provide electrical connectivity between the transformer 3 and the power converter 4. For example, at least one electrical connection 7 may run through the at least one through hole 10 in the at least one separating wall 9 for electrically connecting the power converter 4 and the transformer 3. An example of such a pressure compensated subsea electrical system 5e is schematically illustrated in FIG. 9.

There may be different ways to arrange the power converter 4 and the transformer 3 relative each other. For example, the transformer 3 and the power converter 4 may be arranged such that, in use, the transformer 3 is arranged in a vertical position above the power converter 4. An example of such a pressure compensated subsea electrical system 5c is schematically illustrated in FIG. 6. For example, the transformer 3 and the power converter 4 may be arranged such that, in use, the transformer 3 is arranged in a horizontal position between two power converters 4. An example of such a pressure compensated subsea electrical system 5b is schematically illustrated in FIG. 4.

There may be different ways to provide cooling of the power converter 4 and the transformer 3. For example, the pressure compensated subsea electrical system 5a, 5b, 5c, 5d, 5e may comprise a cooling circuit 11 through which the dielectric liquid 12 flows. The cooling circuit 12 encompasses at least the power converter 4 and the transformer 3. Examples of such pressure compensated subsea electrical systems 5a, 5b, 5c, 5d, 5e are schematically illustrated in FIGS. 3, 4, 6, 8, and 9.

There may be different ways to arrange the power converter 4 and the transformer 3 along the cooling circuit 11. For example, the power converter 4 and the transformer 3 may be serially connected along the cooling circuit 11. Flow of the dielectric liquid 12 inside the cooling circuit 12 may be at least partially driven by natural convection. Further, the transformer 3 and the power converter 4 may be arranged relative the cooling circuit 11 such that the flow of the dielectric liquid 12 is induced by thermal losses in the transformer 3 and is at least partially used to cool the power converter 4.

The pressure compensated subsea electrical system may further comprise a heat exchanger 6. The heat exchanger 6 may be provided on an outside wall of the housing 8. An example of such a pressure compensated subsea electrical system 5d is schematically illustrated in FIG. 8. The heat exchanger 6 may be arranged to receive dielectric liquid 12 from the first housing portion 8a and to provide dielectric liquid 12 to the second housing portion 8b.

Particular embodiments relating to at least some of the above disclosed pressure compensated subsea electrical systems will now be described with references to FIGS. 3 to 9.

According to a first embodiment, as illustrated in FIG. 3, the pressure compensated subsea electrical system 5a may comprise a power converter 4 and a transformer 3 in the same housing 8 where the cooling streams are mixed such that a large surface of the housing 8 can be used to partially cool the power converter 3. Further, putting the transformer 3 and the power converter 4 in a shared housing requires only one pressure compensator 2.

According to a second embodiment of a pressure compensated subsea electrical system 5b, as illustrated in FIG. 4, the constituent cells of the power converter 4 are mounted around the transformer 3, thereby achieving a very compact arrangement. In general terms, the herein provided embodiments create large flexibility of mechanical and electrical design so that the equipment can be made very compact. Only one pressure compensator 2 is needed. FIG. 5 schematically illustrate an arrangement of a transformer 3 and components of a power converter 4 for use in a pressure compensated subsea electrical system 5b according to the embodiment of FIG. 4. Hence, by generalizing the embodiment of FIG. 5 there is provided an arrangement of a transformer 3 and components of a power converter 4 for use in a subsea electrical system where the transformer 3 and the components of the power converter 4 are arranged such that in use the transformer 3 is arranged in a horizontal position between two power converters 4 (or between two components of one power converter).

According to a third embodiment, as illustrated in FIG. 6, where the transformer 3 of a pressure compensated subsea electrical system 5c has been positioned vertically above the power converter 4 such that transformer losses induce a natural convection flow of the dielectric liquid 12 that helps to cool the power converter 4. Only one pressure compensator 2 is needed. FIG. 7 schematically illustrate an arrangement of a transformer 3 and components of a power converter 4 for use in a pressure compensated subsea electrical system 5c according to the embodiment of FIG. 6. Hence, by generalizing the embodiment of FIG. 7 there is provided an arrangement of a transformer 3 and components of a power converter 4 for use in a subsea electrical system where the transformer 3 and the components of the power converter 4 are arranged such that in use the transformer 3 is arranged in a vertical position above (the components of) the power converter 4.

According to a fourth embodiment, as illustrated in FIG. 8, transformer losses induce a natural convection flow that helps cool the power converter 4. In contrast to the embodiment of FIG. 6, the natural convention flow is according to the pressure compensated subsea electrical system 5d of present embodiment achieved by guiding the flow of the dielectric liquid 12 through ducts as formed by the separating wall 9. Further, according to the present embodiment the pressure compensated subsea electrical system 5c has shared cooling cycle that includes an external heat exchanger 6. The flow of the dielectric liquid 12 is guided such that losses in the transformer 3 induce a natural convection flow through the power converter 4. Only one pressure compensator 2 is needed.

According to a fifth embodiment, as illustrated in FIG. 9, it is also possible to design a pressure compensated subsea electrical system 5e such that the transformer 3 and the power converter 4 each have their own separate cooling cycle and use different parts of the housing surface for heat transfer to surrounding sea water. The transformer 3 and the power converter 4 are separated by a separating wall 9 to keep the heat transfer between them limited. There could be small through holes 10 in the separating wall 9 so that the dielectric liquid 12 is in pressure communication and only one pressure compensator is needed 12. The through holes 10 may further be utilized for enabling an electrical connection 7 to be established between the transformer 3 and the power converter 4.

The invention has mainly been described above with reference to a few embodiments. However, as is readily appreciated by a person skilled in the art, other embodiments than the ones disclosed above are equally possible within the scope of the invention, as defined by the appended patent claims. For example, although oil has been used as an example of the dielectric liquid 12, it is understood that any suitable dielectric liquid 12 could be used. For example, although reference has been made to a single power converter 4, any of the herein disclosed pressure compensated subsea electrical systems 5a, 5b, 5c, 5d, 5e may comprise a plurality of power converters 4.

Further, although reference has been made to a pressure compensated subsea electrical system 5a, 5b, 5c, 5d, 5e, according to one aspect there is also provided a subsea converter. Such a subsea converter may comprise any components or features of the herein disclosed pressure compensated subsea electrical systems 5a, 5b, 5c, 5d, 5e. Thus, a subsea converter may comprise a housing 8 filled with a dielectric liquid 12, where the housing has a first housing portion 8a and a second housing portion 8b in pressure communication with each other, where the first housing portion comprises a transformer 3, and where the second housing portion comprises a power converter 4. Thus, a subsea converter may further comprise a pressure compensator 2 arranged to compensate pressure inside the housing, where the pressure compensator is enabled to compensate pressure in both the first housing portion and the second housing portion. Thus, a subsea converter may further comprise any optional components or features of the herein disclosed pressure compensated subsea electrical systems 5a, 5b, 5c, 5d, 5e.

The invention claimed is:

1. A pressure compensated subsea electrical system, comprising: a subsea housing filled with a dielectric liquid, the subsea housing having a first housing portion and a second housing portion in pressure communication with each other, the first housing portion comprising a transformer, and the second housing portion comprising a power converter; a pressure compensator arranged to compensate pressure inside the subsea housing to counter an external pressure of a liquid medium surrounding the subsea housing, wherein the pressure compensator is enabled to compensate pressure in both the first housing portion and the second housing portion; and a cooling circuit through which the dielectric liquid flows, the cooling circuit encompassing the power converter and the transformer, the transformer being arranged in a vertical position directly above the power converter so that the flow of the dielectric liquid is generated by thermal losses of the transformer and cools the power converter.

2. The pressure compensated subsea electrical system according to claim 1, wherein the pressure communication is fluid communication.

3. The pressure compensated subsea electrical system according to claim 2, wherein the first housing portion comprises a tank wall for transferring heat from the power converter.

4. The pressure compensated subsea electrical system according to claim 1, wherein the first housing portion comprises a tank wall for transferring heat from the power converter.

5. The pressure compensated subsea electrical system according to claim 4, wherein the tank wall comprises corrugations or cooling fins.

6. The pressure compensated subsea electrical system according to claim 1, wherein the power converter and the transformer are serially connected along the cooling circuit.

7. The pressure compensated subsea electrical system according to claim 6, wherein a flow of the dielectric liquid inside the cooling circuit is driven at least partially by natural convection.

8. The pressure compensated subsea electrical system according to claim 7, wherein the transformer and the power converter are arranged relative the cooling circuit such that the flow of the dielectric liquid is induced by thermal losses in the transformer and is at least partially used to cool the power converter.

9. The pressure compensated subsea electrical system according to claim 6, wherein the transformer and the power converter are arranged relative the cooling circuit such that the flow of the dielectric liquid is induced by thermal losses in the transformer and is at least partially used to cool the power converter.

10. The pressure compensated subsea electrical system according to claim 1, wherein the power converter comprises cells and the transformer comprises a plurality of parts, and wherein each of the parts of the transformer is aligned with a respective portion of the cells of the power converter.

* * * * *